March 7, 1967 M. P. LEPSELTER ETAL 3,307,239

METHOD OF MAKING INTEGRATED SEMICONDUCTOR DEVICES

Filed Feb. 18, 1964

INVENTORS M. P. LEPSELTER
D. A. NAYMIK
BY H. W. Lockhart
ATTORNEY 3,307,239

METHOD OF MAKING INTEGRATED SEMICONDUCTOR DEVICES

Martin P. Lepselter, Franklin Park, and Daniel A. Naymik, Summit, N.J., assignors to Bell Telephone Laboratories, Incorporated, New York, N.Y., a corporation of New York Filed Feb. 18, 1964, Ser. No. 345,696
5 Claims. (Cl. 29—25.3)

This invention relates to semiconductor integrated circuit devices and particularly to the fabrication of a multiple array of semiconductor elements which are electrically insulated one from another and form a single unitary structure.

In D. A. Naymik Patent 3,235,428, granted February 15, 1966, there is disclosed a technique for fabricating an array of individual semiconductor wafers bonded together by a thin vitreous film. It is disclosed in that application that a variety of mosaics of semiconductor material in slice form may be produced.

In accordance with this invention, it has been found that an improved integrated circuit structure may be formed by an extension of the technique disclosed in the application noted above. In particular, relatively heavy metal interconnections may be deposited on at least one face of the multiple array of semiconductor elements in accordance with the technique disclosed in the application of M. P. Lepselter, Serial No. 331,168, filed December 17, 1963, and assigned to the assignee of this application. The glass-bonded structure then is treated with an etchant which removes selectively the glass bonding material, leaving the array of semiconductor elements mechanically supported by the deposited metal interconnections. The array, or portions of it, then may be mounted on suitable substrates for final packaging and further electrical interconnection.

Thus a feature of this invention is the use of a vitreous bonding material for temporary support of a mosaic of semiconductor elements during which time a pattern of deposited metal interconnections is applied to the integrated circuit array. Subsequently, a selective etchant is used to remove the vitreous bonding material so that dielectric separation ultimately is provided by the empty space or seam between elements.

The invention and its other objects and features may be better understood from the following detailed description taken in connection with the drawing in which.

Figure 3:
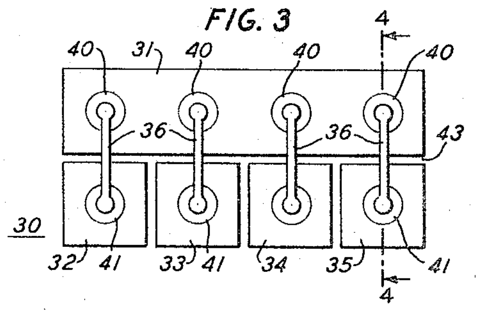
FIGS. 3 and 4 are plan and section views, respectively, of a single OR gate element made in accordance with this invention.
Figure 4:
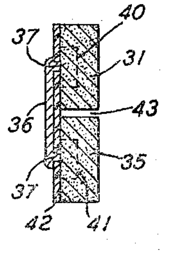
Figure 2:
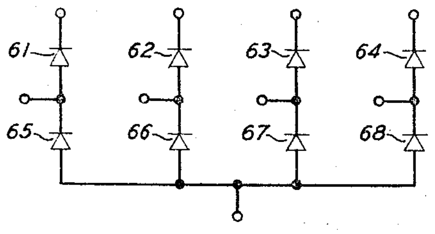
FIG. 2 is a schematic representation of the circuit of a single OR gate element.

An integrated circuit element illustrating the method of this invention is shown in FIGS. 3 and 4. This integrated circuit element is an assembly of semiconductor pn junction diodes in an arrangement illustrated schematically, circuitwise, in FIG. 2 to form an OR gate.

Referring to FIGS. 3 and 4, the semiconductor integrated circuit element 30 comprises a rectangular silicon wafer 31 and four square silicon wafers 32, 33, 34 and 35. The major portion of the large wafer 31 is p-type conductivity while the small wafers 32, 33, 34 and 35 are of n-type conductivity silicon. Four circular zones 40 define diffused n-type regions in the large wafer 31. The corresponding circular zones 41 define p-type regions in the square wafers. Thus eight diffused pn junctions form the diodes 61 through 68 in the OR gate circuit of FIG. 2.

The element 30 is supported in the configuration shown by the series of relatively heavy metal interconnections 36. As shown in FIG. 4, these metal interconnections or straps 36 provide electrical connections between the diffused regions 41 of the square wafers 32, 33, 34 and 35 and the corresponding regions 40 of the rectangular wafer 31. Typically, the metal interconnections 36 are a buildup of several different metals with the heaviest layer being gold to provide the structural support. One preferred method of producing the integrated OR gate element 30 will now be described in terms of processing a slice containing a multiplicity of the gate elements.

Figure 1:
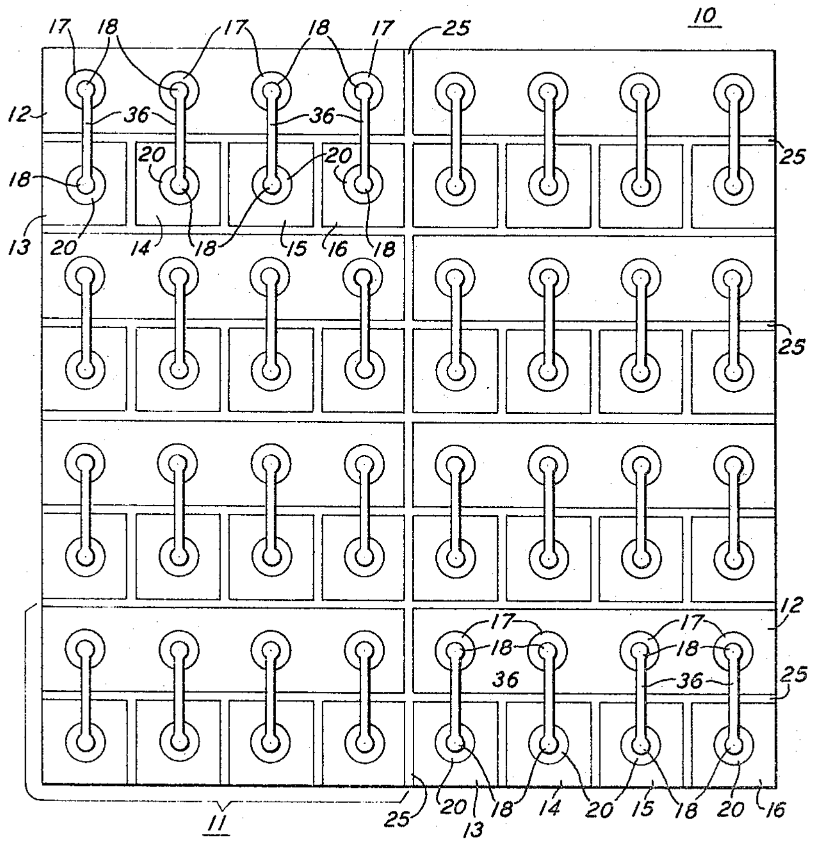
FIG. 1 is an exemplary plan view of a mosaic slice of semiconductor elements with metallic interconnections to form eight separate "OR" gate circuits.

Referring to FIG. 1, the slice 10 comprises a vitreously bonded array composed of eight OR gate elements 11 arranged in two columns of four each. One method of making the array represented by the slice 10 is disclosed in the D. A. Naymik patent noted above. The array is supported initially by a suitable glass or other vitreous material in the seams 25. One useful material for this purpose is a germania-silica ($GeO_2$-$SiO_2$) glass mixture which has good thermal matching characteristics.

The array of bonded silicon wafers forming the slice 10 next is processed to produce the diffused junction regions defined by the circular areas 17 on the rectangular wafers 12 and 20 on the smaller square wafers 13, 14, 15 and 16. Inasmuch as the regions 17 are n-type conductivity and the regions 30 are p-type conductivity, the diffusion heat treatments are done successively. The techniques for carrying out these steps are conventional and well known, and several alternatives are available. According to one method the surface of the slice 10 is coated with a silicon oxide and then, using a photoresist technique, an array of openings are produced in the oxide coating corresponding to the circular areas 17 on the rectangular wafers 12. Using a donor impurity, the n-type regions then are formed by diffusion into the exposed zones. Following this the oxide coating is reconstituted on the entire slice and an array of holes corresponding to the areas 20 are similarly formed using a photoresist method. By means of an acceptor diffusion treatment, the p-type conductivity regions then are formed.

Next, the oxide coating is again reconstituted and using a photoresist technique a series of small central openings 37, shown in cross section in FIG. 4, corresponding to the circular areas 18, are opened through the oxide to expose a portion of the surface of each diffused region. These openings 37 are to enable the making of a low resistance contact to the underlying semiconductor material. A thin layer of about 1000 Angstroms of chromium then is deposited over the entire surface of the slice 10, overlying the oxide coating and making contact to the underlying silicon through the opening 37. Atop the chromium layer, a heavier layer of approximately 5000 Angstroms of silver is deposited. Next, a mask in the form of a photoresist pattern is produced on the surface of the slice and a heavy layer of gold is deposited through the mask to form the interconnecting straps 36. Typically, this gold layer is about 120,000 Angstroms in thickness and serves to interconnect the ohmic contact areas 18 between the adjoining semiconductor pn junction diodes as shown. Further teachings relative to multilayer metal interconnections of this type are set forth in the patent application of M. P. Lepselter referred to hereinbefore.

For ease of handling, the slice 10 now is temporarily affixed to a substrate using an etch-resistant wax. The slice is affixed with the metal-plated face to the substrate with the back surface exposed. The assembly then is immersed in a hydrofluoric acid solution for a period of several minutes. Standard chemical grade solutions in the range from 48 to 52 percent concentration are satisfactory. During this step, the etchant rapidly removes by dissolution the glass bonding material in the seams 25. The etching process is carried out for a sufficient time to remove all of the glass from seams 43, as shown in FIG. 4, without substantially attacking the oxide coating 42. The etchant has a much slower rate of attack against the silicon oxide, hence control is not too difficult.

As a consequence of the hydrofluoric acid etch, the slice 10 is separated into the eight separate OR gate elements 11. The elements are further processed by first immersing them in a ferric-nitrate bath which removes the exposed silver layer on the surface of each element. This treatment is followed by immersion in a hydrochloric acid bath which removes the initial chromium layer. The gold, of course, is not attacked and, accordingly, acts as a mask to retain the thin silver and chromium layers underlying the gold straps. Alternatively, these metal layers may be removed by "back-sputtering" as disclosed in the aforementioned application of Lepselter and in his Patent No. 3,271,286.

Thus, the mosaic array produced by the vitreous bonding operation of the previous invention of D. A. Naymik is processed into the logic circuit element 30 of FIG. 3 in which the silicon wafers are held in spaced-apart relation by the metal straps 36 which function also as electrical interconnections.

The OR gate element then may be mounted in suitable packages and interconnected with other elements or to external leads by thermocompression bonding or other suitable means.

In this specific embodiment, the integrated circuit element is a five-wafer OR gate. It will be appreciated that a wide variety of integrated circuit configurations can be fabricated using the same principles. Moreover, other multiple layer combinations such as titanium, platinum and gold may be used.

Furthermore, a wide range of kinds of devices may be fabricated in the individual wafers by a variety of techniques. For example, in addition to transistors and diodes, resistors and field effect devices may be produced. In particular, the semiconductor material may be treated so that it functions as a low resistance path, convenient for making crossover connections. In such instance, one metal strap would traverse an entire wafer on the oxide surface, while partial straps normal thereto would make low resistance contact through the oxide to the high conductivity semiconductor.

Accordingly, although the invention has been disclosed in terms of a specific embodiment, other arrangements may be devised by those skilled in the art which also will be within the scope and spirit of the invention.

What is claimed is:

1. The method of making an integrated circuit element comprising fabricating a mosaic of vitreously bonded individual semiconductor wafers in the form of a slice, diffusing into at least a portion of said wafers significant impurities to form pn junctions in said wafers, forming a protective oxide coating on said diffused surface, opening holes through said oxide coating to expose underlying semiconductor material, depositing a thin layer of a first metal on said oxide and said exposed semiconductors material, depositing a heavier layer of a second metal on said first metal, depositing on a limited portion of said mosaic a heavy layer of gold interconnecting individual semiconductor devices of said array thereby defining integrated circuit elements, subjecting said array to a chemical treatment to remove the vitreous bonding between said individual wafers thereby separating said slice into said circuit elements, removing from said circuit elements the layers of said first and said second metals not covered by said gold, said circuit elements being mechanically supported thereafter by said metal interconnections.

2. A method in accordance with claim 1 in which said first metal layer is one selected from the group consisting of chromium, titanium and tantalum, and the layer has a thickness of about 1000 Angstroms.

3. A method in accordance with claim 1 in which the second metal layer is one selected from the group consisting of platinum and silver and has a thickness of about 2000 Angstroms.

4. The method in accordance with claim 1 in which said first and second metal layers are removed by chemical treatment.

5. The method in accordance with claim 1 in which said first and second metal layers are removed by back-sputtering.

References Cited by the Examiner

UNITED STATES PATENTS

| | | | |
|---|---|---|---|
| 2,973,466 | 2/1961 | Atalla | 29—155.5 X |
| 2,981,877 | 4/1961 | Noyce. | |
| 3,252,205 | 5/1966 | Hancock | 29—155.5 |

OTHER REFERENCES

IBM Tech. Disc. Bull., vol. 3, No. 12, May 1961, pp. 26, 27.

IBM Tech. Disc. Bull., vol. 3, No. 12, May 1961, pp. 30, 31.

JOHN F. CAMPBELL, *Primary Examiner.*

WILLIAM I. BROOKS, *Examiner.*